United States Patent [19]

Schoeff

[11] 4,055,773
[45] Oct. 25, 1977

[54] MULTISTAGE ELECTRICAL LADDER FOR DECREMENTING A SIGNAL INTO A PLURALITY OF WEIGHTED SIGNALS

[75] Inventor: John A. Schoeff, Los Gatos, Calif.

[73] Assignee: Precision Monolithics, Inc., Santa Clara, Calif.

[21] Appl. No.: 642,770

[22] Filed: Dec. 22, 1975

[51] Int. Cl.² .......................................... H03K 13/04
[52] U.S. Cl. ............................ 307/229; 307/296 R; 340/347 DA
[58] Field of Search ................... 307/229, 230, 296; 340/347 AD, 347 DA

[56] References Cited

U.S. PATENT DOCUMENTS

| | | | |
|---|---|---|---|
| 3,699,568 | 10/1972 | Thompson et al. | 340/347 DA |
| 3,747,088 | 7/1973 | Pastoriza | 340/347 DA |
| 3,842,412 | 10/1974 | Spofford, Jr. | 340/347 DA |
| 3,890,610 | 6/1975 | Cahen | 340/347 DA |

Primary Examiner—Stanley D. Miller, Jr.
Assistant Examiner—B. P. Davis

[57] ABSTRACT

Disclosed is a multistage resistor and transistor network for use in forming a plurality of weighted signals and which utilizes a conventional R-2R ladder network connected to a single reference means for decrementing the reference signal into weighted signals and a remainder signal. Rather than terminating the remainder, as in the prior art, at least one slave ladder network is connected for receiving the remainder signal and decrementing the remainder signal into a plurality of decrementally weighted signals to be taken in parallel with the decrementally weighted signal segments of a master ladder.

13 Claims, 7 Drawing Figures

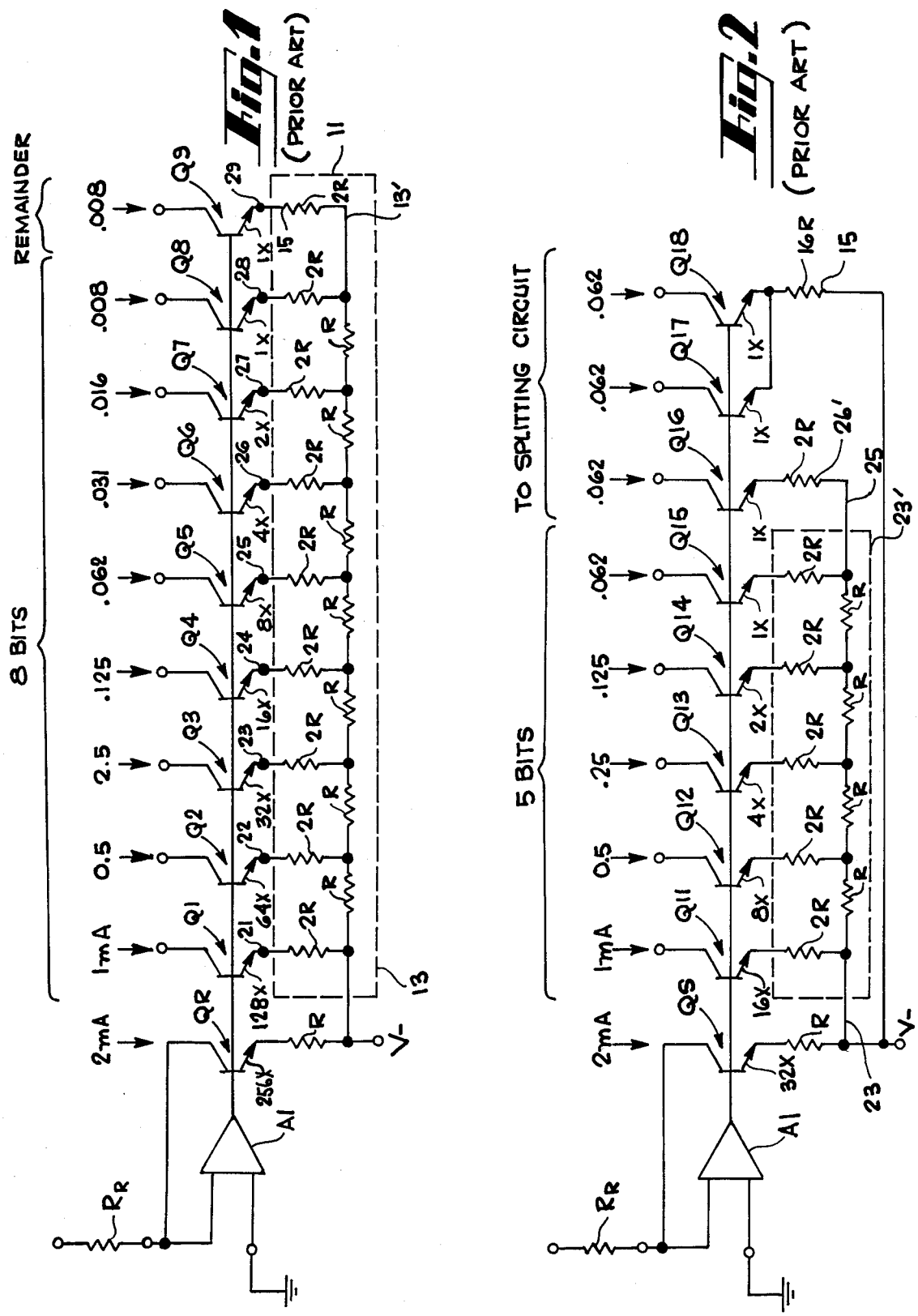

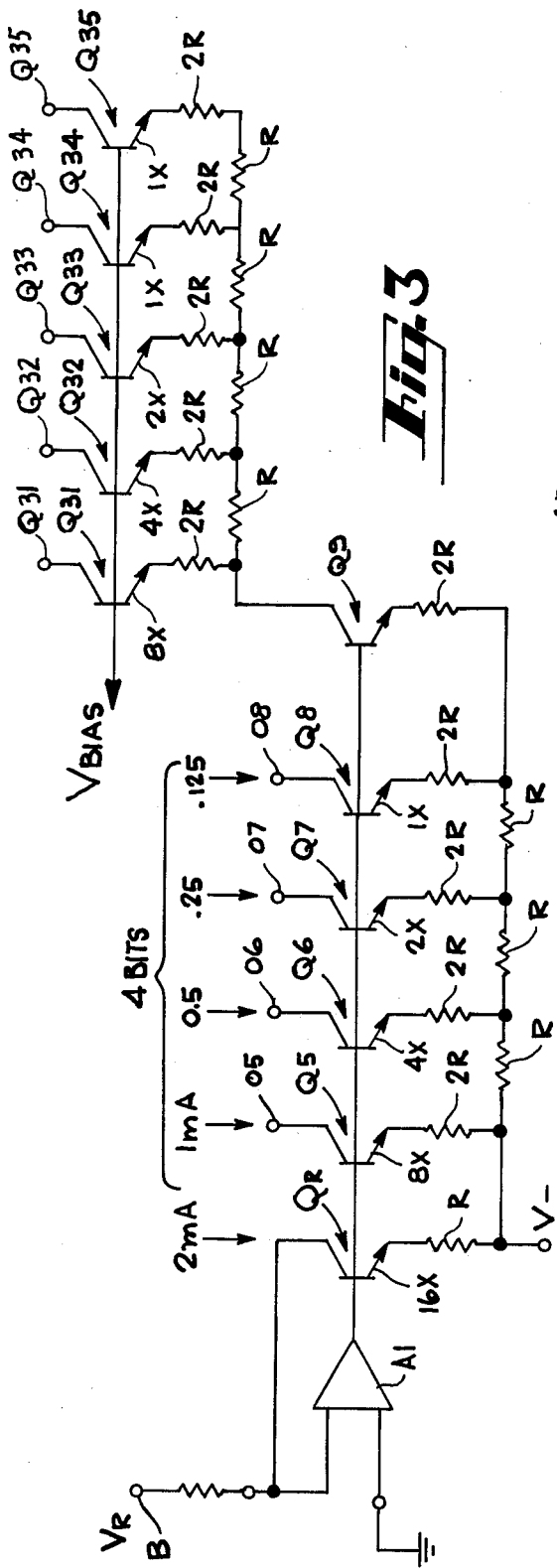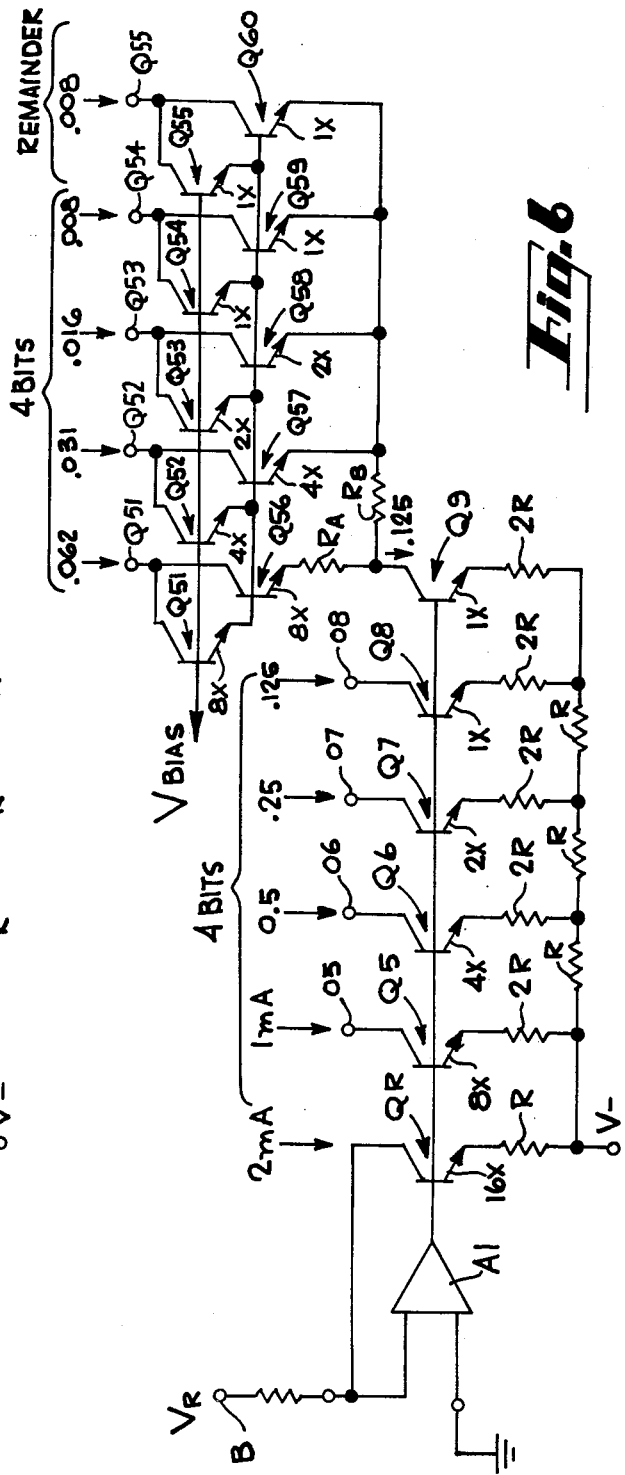

MULTISTAGE ELECTRICAL LADDER FOR DECREMENTING A SIGNAL INTO A PLURALITY OF WEIGHTED SIGNALS

BACKGROUND OF THE INVENTION a. Field of the Invention

The present invention relates generally to the field of solid state circuits and more particularly to an improved electrical ladder network for use in forming decremntally weighted signals of the type used in digital to analog converters.

b. Prior Art

Weighted resistor networks may be used in many fields of application. One exemplary field is in digital to analog converters wherein a digitally coded signal comprising a plurality of ones and zeros is to be converted into an equivalent analog output. A good explanation of digital to analog converters of the prior art, including a discussion of prior art resistor networks of the type found herein, is described in the book "Analog Integrated Circuit Design" by A. Grebene, Van Nostrand, New York, 1973. The aforementioned text describes the requisites of a digital to analog converter including a reference signal, a set of binary switches which simulate binary coefficients of a number to be converted, a resistive weighting network and an output summing means. The present invention relates to the resistive weighting network used in such a converter.

FIG. 1 shows a digital to analog converter of the prior art including a resistive weighting network known as an R-2R resistor ladder. The resistor ladder of the prior art is shown within the dashed line 11. On the left hand side the network is referenced to a fixed voltage V−, while on the right hand side, the ladder terminates in line 13' connected to a terminating resistor 15 having value 2R. The prior art R-2R ladder has a plurality of outputs 21, 22, 23, 24, 25, 26, 27, 28. It will be noted that the ladder includes resistor "rungs" of value 2R and "extensions" of value R. This combination of rungs and extensions serves to divide the current in each rung such that the current in each rung is decremented by fifty percent of the preceding rung. For example, if each output 21-28 is connected to a respective current source Q1-Q8, the current sourced by the first transistor Q1 will be twice the current sourced by the second transistor Q2 which in turn will be twice the current sourced by the third transistor Q3 and so on. Thus, if the first transistor Q1 sources 1 milliamp of current, the second transistor Q2 will source 0.5 milliamps, the third 0.25 milliamps; the fourth 0.125 ma.; the fifth, 0.062 ma; the sixth 0.031 ma; the seventh 0.016 ma; and the eight 0.008 ma; with a remainder of 0.008 ma sourced by the terminating transistor Q9.

In the prior art apparatus of FIG. 1, each of the current sources Q1–Q8 would generate an emitter voltage error for each ladder rung because a different $V_{BE}$ would exist for each transistor. However, to offset this the geometry of the transistors Q1–Q8 has been scaled so as to maintain the same current density through each emitter junction. Thus, the base-emitter junction of Q1 is 128 times the area of the base-emitter junction of Q8. If the base-emitter area of Q1 is designated 128x, then the remaining area for successive transistors are as follows: Q2, 64x; Q3, 32x; Q4, 16x; Q5, 8x; Q6, 4x; Q7, 2x; Q8, 1x; and Q9 also being 1x since it will be recalled that the resistive drop across the terminating resistor is to be the same as that in the last resistor. The purpose of the reference transistor QR is to translate a standard voltage reference $V_R$ into a stable current. To achieve this purpose an operational amplifier A1 has an input connected to the reference resistor RR and an output connected to the reference transistor QR as well as the remaining transistors Q1–Q9 for the purpose of supplying base current to the aforesaid transistors thereby allowing them to sink current. The reference transistor has a $V_{BE}$ character which is scaled to Q1 at a two-to-one relationship.

In practice, the degree of emitter scaling shown in FIG. 1 is difficult to achieve. An alternate R-2R ladder of the prior art is shown in FIG. 2. Once again a reference voltage $V_R$ is provided and is converted to a reference current by the operational amplifier A2 having the reference transistor QS in its feedback booth. Reference current is supplied to a plurality of transistors Q11, Q12, Q13, Q14, Q15, Q16, Q17 and Q18. A resistive weighting network, which is essentially the same as the weighting network 11 of FIG. 1 is shown in the dashed line 21, i.e., an R-2R resistor ladder. On the left hand side, the network is referenced to a fixed voltage V−. This combination of rungs, having resistance 2R, and extensions, having value R, serves to divide the current in the network such that the current in each rung is decremented by 50 percent of the preceding rung. The right hand side of the ladder terminates in line 23' connected to a terminating resistor 25 having value 2R. By analogy with the currents of FIG. 1, it will be seen that the ladder of FIG. 2 decrements currents in much the same way. In FIG. 2 however the terminating resistor and its associated transistor Q16 are placed in parallel with transistors Q17, Q18 which have a resistor 26 in the emitter circuit thereof, connected to the fixed voltage V−. The two transistors Q17, Q18 duplicate the current in the terminating transistor Q16 and are similarly constructed to transistor Q16. Thus, although the resistive load of the transistors Q17, Q18 is much greater than 2R, however, several R and 2R resistors have been eliminated while providing a second ladder, with a low number of resistors in series with a first ladder, of the type described with respect to FIG. 1. The problem with the second ladder circuit of FIG. 2 is that the currents therein are not decremented with respect to each of the transistors Q16, Q17 and Q18. Rather the currents drawn are the same. A further method must be applied to decrement these last currents, without adding extra transistor scaling range or many extra resistors. Thus, in FIG. 2a lower scaling range was achieved by adding extra resistors and sacrificing current decrements, resulting in an incomplete ladder circuit.

It is an object of the invention to provide a minimum scaling range, use fewest resistors, and provide an output of n decremented currents with no further circuitry needed.

SUMMARY OF THE INVENTION

The above object has been met with a combination master ladder and connected slave ladder. The master ladder has an input reference signal and a plurality of scaling devices with associated output devices connected for receiving the reference signal and dividing it into a plurality of decrementally weighted signals. The master ladder also includes a terminating device for generating a remainder signal, left over after providing the decrementally weighted signals.

A first slave ladder includes a plurality of second signal scaling devices each having an associated output device and connected to the master ladder for receiving the remainder signal from the master ladder terminating device. The remainder signal is divided into a plurality of weighted signals applied at each of said output devices. A second terminating device generates a second remainder signal, left over after a first remainder signal is decremented in the slave ladder.

The scaling means of either ladder may be an R-2R resistor ladder in combination with transistors which are used for output devices. Alternatively, the signal scaling means may be cascaded transistors, of the bipolar type, the MOS type, or bipolar Darlington pairs. For bipolar transistors, base current compensation may be provided by feedback transistors which are connected to receive current from the bases of the scaled transistors which form the scaling means and feed it back to the collectors thereof. To provide the desired degree of feedback, the feedback transistors are also themselves scaled in the same ratio as the connected scaling transistors.

In integrated circuit construction, transistors are relatively inexpensive to construct, since they occupy very little chip area and resistors are rather expensive to construct because they usually occupy a large amount of chip area. The slave ladder of the present invention provides a means for decrementing signals using the fewest number of resistors, while using a very small scaling range. Other advantages of the present invention will be seen from the description provided below.

BRIEF DESCRIPTION OF THE DRAWINGS

FIG. 1 is an electrical schematic of a prior art R-2R ladder.

FIG. 2 is an electrical schematic of an alternate prior art ladder having multiple stages, wherein the complete first stage is shown and the current output portion of the second stage is shown.

FIG. 3 is an electrical schematic showing a master ladder and a slave ladder of the present invention connected thereto.

FIG. 6 is a complete electrical schematic of the master ladder with a slave ladder connected thereto.

DESCRIPTION OF THE PREFERRED EMBODIMENT

Figure 4:
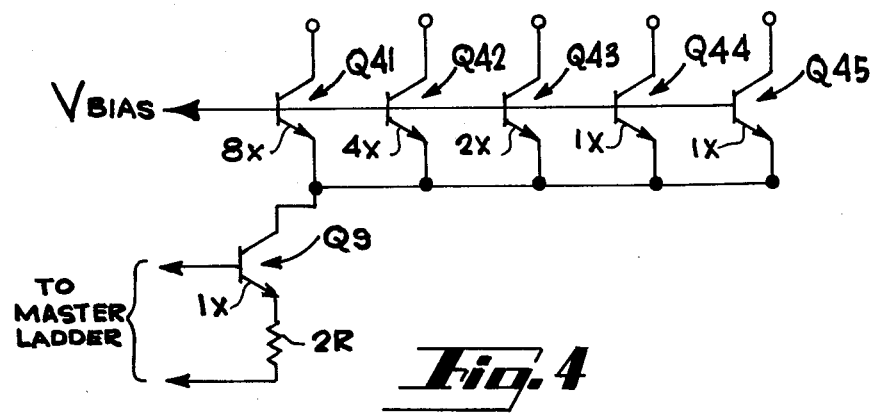
FIG. 4 is a partial electrical schematic of the apparatus of the present invention showing the terminating means of a master ladder connected to an alternate slave ladder of the present invention.

With reference to the previous descriptions of FIGS. 1 and 2, a large number of resistors was required, together with a wide range of transistor scaling, indicated on the drawings. In integrated circuit construction, resistors are constructed by placing diffused or thin film strip areas on a chip and connecting desired strips. According to this construction a 2R resistor would comprise a pair of strips in series. Thus, it can be seen that with respect to FIG. 1, 26R's are required, as well as a scaling range of 256X.

In FIG. 2 it is seen that a more limited scaling range has been produced, 32X, but the number of resistor R's has increased to 33, due principally to the use of the 16R resistor which produces additional signals, which signals are necessary for further decrementing in order to produce the same number of decremented signals as in FIG. 1.

In the present invention, a limited amount of scaling is used. This is achieved by means of a master ladder combined with a slave ladder. The master ladder includes a scaling means of the type found in the prior art. The master ladder includes an input reference signal which may be supplied by an operational amplifier connected to a reference voltage, $V_R$, as in FIG. 1, which supplies a reference current to the master ladder output devices, such as the transistors Q1-Q8 in FIG. 1. The master ladder decrements the input signal into a plurality of weighted signals, one signal associated with each output device plus a terminating device for generating a remainder from the leftover signal.

In accord with the present invention, a slave ladder network is provided with a second signal scaling means which receives the remainder signal from the master ladder and divides it into a plurality of decrementally weighted signals which are delivered to second output devices, one of which is associated with each decrementally weighted signal.

In FIG. 3, the transistor Q9 corresponds to the transistor Q9 of FIG. 1 which is a first terminator for the master ladder network, which was previously described as an R-2R ladder with transistor output devices, Q1-Q8. The remainder signal which is sourced by Q9 in FIG. 3 is divided by the network of transistors Q31-Q35 and the associated resistor ladder which forms an R-2R ladder. The entire combination which is connected to transistor Q9 is a first slave ladder with a current signal scaling means which comprise the combination of resistors R and 2R and they connect transistors Q31-Q35. Each 2R rung and R extension of the resistor ladder, successively divide current by fifty percent, while the common connection between bases of the transistors Q31-Q35 keeps the upper end of each 2R resistor at approximately the same potential. The collector electrode of each transistor serves as a second output device for outputting a weighted signal, i.e., a current level which has been divided by 50 percent with respect to a neighboring current. Thus, the second outputs, from output terminals 031, 032, 033, 034 when taken in parallel with the first outputs from output terminals 05, 06, 07, 08 provide a full range of decrementally weighted signals.

For an eight bit ladder, the master ladder should have a reference transistor, $Q_R$, as in FIG. 1, plus four decrementing transistors Q1-Q4 and a remainder transistor Q9. The slave ladder has four decrementing transistors Q31-Q34 plus a terminating transistor Q35. The transistors Q31-Q34 have scaled emitters to limit the error due to different $V_{BE}$'s which would exist in each transistor. By scaling the geometry of the base emitter junctions, the same current densities may be maintained through the junctions and the same $V_{BE}$ can be maintained across base-emitter junctions. Thus, in FIG. 3 a four bit master ladder has a scaling of eight to one, while the slave ladder which includes the transistors Q31-Q34 has the same eight to one scaling. Thus, a master-slave ladder has been provided wherein scaling is minimized. In FIG. 4, a slave ladder has been provided which comprises the scaled transistors Q41, Q42, Q43 and Q44.

Q45 is provided as a second terminating means for generating a second remainder signal from the remaining current in the slave ladder. In the aforementioned transistors Q41-Q44 have scaled emitters, with each transistor handling approximately 50 percent less current than the preceding transistor. This is accomplished by scaling the base-emitter junction in proportion to the desired current. For example, Q41 has an area eight times that of Q44, Q42 has an area four times greater, Q43 has an area two times greater. The terminating transistor Q45 has a base-emitter junction area which is the same as Q44 and thus the current therein is the same as the current in Q44. The output device for the transistors Q41-Q44 is the collector electrode of each respective transistor and each collector is thus associated with a decrementally weighted signal. The transistors Q41-Q45 have a common base which is connected to a bias voltage. In practice, the bias voltage may be supplied by referencing it, for example, through a diode pair, to the voltage supplied by the output of the operational amplifier which receives the reference voltage $V_R$, as in FIG. 1.

The transistors Q41-Q45 in FIG. 4 may be bipolar transistors, MOS transistors or Darlington pairs. The main feature, is that the scaling described with reference to bipolar transistors, be provided in the selected transistor configuration.

In a circuit of FIG. 4, the collector current of each transistor is lower than its emitter current, due to base current loss. Thus the weighting of each output of the slave ladder has some error when compared to the outputs of the master ladder.

Figure 5:
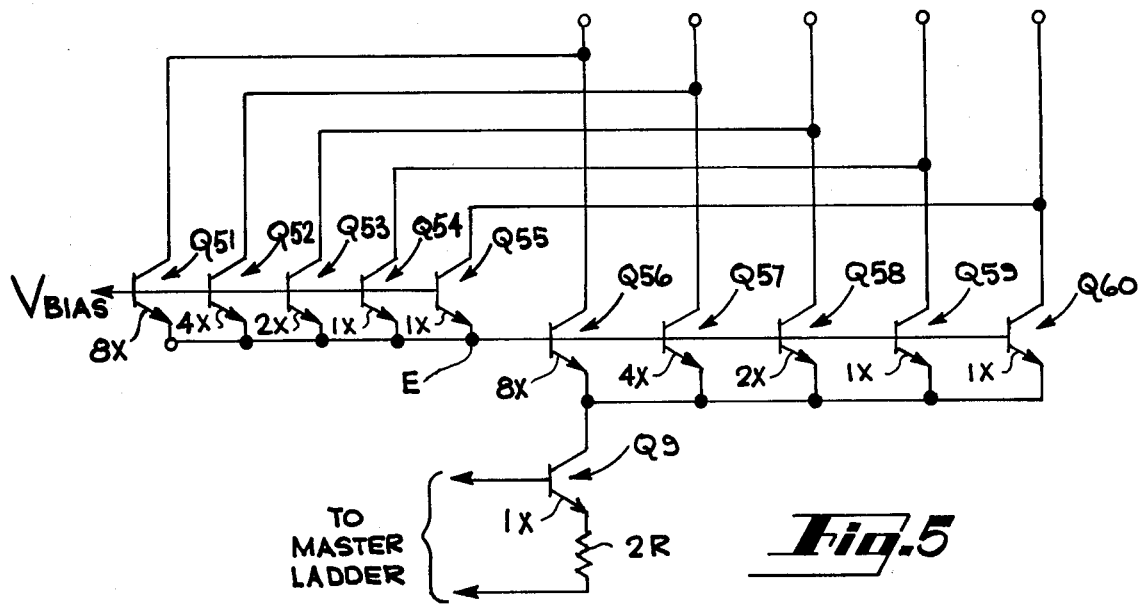
FIG. 5 is a partial electrical schematic showing the terminating means of a master ladder connected to a slave ladder of the present invention, having base current compensation.

In FIG. 5, the base current error signal from a plurality of scaled transistors in a slave ladder is detected, scaled, and fed back to each transistor for substantially reducing the base current error.

In FIG. 5, the transistor Q9 is the terminating transistor of a master ladder, not shown. The transistors Q51, Q52, Q53, Q54, Q55 divide the total base current of transistors Q56 through Q60 and apply it in a scaled manner to the outputs of Q56 through Q60. Thus, the effective current gain of transistors Q56 through Q60 is multiplied by the current gain of the corresponding transistor in the series Q51 through Q55, and the collector current error caused by the base currents of Q56 through Q60 is reduced by a factor of beta of the compensating transistors Q51 through Q55. The collector of Q56 is connected to the collector of transistor Q51; the collector of transistor Q57 is connected to the collector of transistor Q52; and so on. Each of the compensating transistors Q51-Q55 has a base-emitter junction scaled in the same proportion as the transistor of the slave ladder network Q56-Q60, to which it is connected. Thus, the base-emitter junctions of the transistors Q51-Q55 are scaled in an eight to one ratio as indicated in FIG. 5, the same ratio as the transistors Q56-Q60, as shown in the figure. By scaling in this manner, the transistor Q51 is able to provide a proportionally greater amount of feedback of base error current to the transistor Q56 which was contributing a proportionally larger share of error current because of its scaled emitter.

In FIG. 6, a complete master-slave network of the present invention is illustrated. The master ladder comprises an R-2R resistor network connected to output transistors Q5, Q6, Q7, Q8 and Q9. A reference signal is applied at an input node B by the voltage $V_R$ which is fed to the operational amplifier A1 which in turn drives the reference transistor QR. Each of the transistors in the master ladder Q5-Q8 has a respective output terminal 05, 06, 07, 08 for outputting decrementally reduced current levels as indicated by the value on the figure whereas the input current through the reference transistor Qr is 2 milliamps, the decremented levels through Q5-Q8 are respectively 1 milliamp, 0.5 m.a., 0.25 m.a., 0.125 m.a. and in the terminating transistor Q9 another 0.125 m.a.

The slave ladder which is connected to the collector of transistor Q9 is essentially the same slave ladder illustrated in FIG. 5. The only exception is that two resistors, $R_A$ and $R_B$ of equal value, but large compared to the dynamic emitter resistance of transistors Q56 and Q57 serve to divide the remainder current from transistor Q9 into equal parts. The reason that it is desired to split the current from the terminating transistor Q9 into roughly equal parts is that it is known that approximately 50 percent of error generated in the slave network Q56-Q60 is allocated to the transistor Q56. Since Q51 feeds back current which should compensate for the base error current the transistor Q56 contributes very little output error current. This is desirable because the output Q56 represents the most significant signal or bit with reference to the remaining outputs, since the most significant bit is defined as the one having the greatest increment of current and least significant bit is the one having the most decremented signal level. According to this scheme, half of the error budget is then allocated to the transistors Q57-Q60 and no further resistors are provided since scaling provided in the transistors Q57-Q60 provides a good approximation for the manner in which the emitter current is to be allocated. In other words, allocation of current flowing through $R_B$ is exactly in proportion to the sum of the sizes of the base-emitter junctions of the slave ladder transistors Q57-Q60. One of the reasons that further resistors are not provided for a more perfect allocation of the error signal budget is that in integrated circuit construction the cost of providing such resistance in terms of surface area of an integrated circuit chip is large and for the least significant bits of the slave ladder, the error budget allocation made by the scaled emitter transistors Q57-Q60 is adequate for yielding good accuracy. The transistor Q60 and its associated feedback transistor Q55 terminate the slave ladder by providing a terminating means which duplicates the least significant signal bit, transistor Q59 and its associated feedback transistor Q54.

The master-slave ladder illustrated in FIG. 6 shows current outputs in the master ladder of 1 m.a., 0.5 m.a., 0.25 m.a., 0.125 m.a., at output terminals 05, 06, 07, 08, respectively, representing the four most significant signal bits while the slave ladder is shown to have current levels of 0.062 m.a., 0.031 m.a., 0.016 m.a. and 0.008 m.a. at output terminals 051, 052, 053, 054, respectively, representing the next four most significant bits plus a terminating current of 0.008 m.a. at output terminal 055. All of the transistors are the same type when the apparatus is constructed by means of integrated circuit construction since it is easy to fabricate transistors of the same type in the same processing operation. Moreover, since the scaling ratios are the same for the master and slave ladders, another processing benefit is achieved inasmuch as a minimal scaling ratio is achieved for an electrical ladder having a large number of outputs. As mentioned previously, one of the most distinct advantages is that a minimum number of resistors is fabricated.

It should be noted that scaling is a geometric property of the circuit and is independent of the input current level. In other words, variations in the reference signal affects all of the ladder outputs in the same way. The output from the ladder is a true current output and no further scaling is required as in the prior art circuit shown in FIG. 2.

Moreover, the circuit of FIG. 6 dissipates a minimum amount of power because all the current appears at the outputs in decremented form. In FIG. 2, for example, current from the last several transistors will have to be split again and the undesirable current will be wasted. In integrated circuit construction, where the transistors are all formed on the same substrate, the geometrical scaling of the devices provides for automatic temperature compensation.

Figure 7:
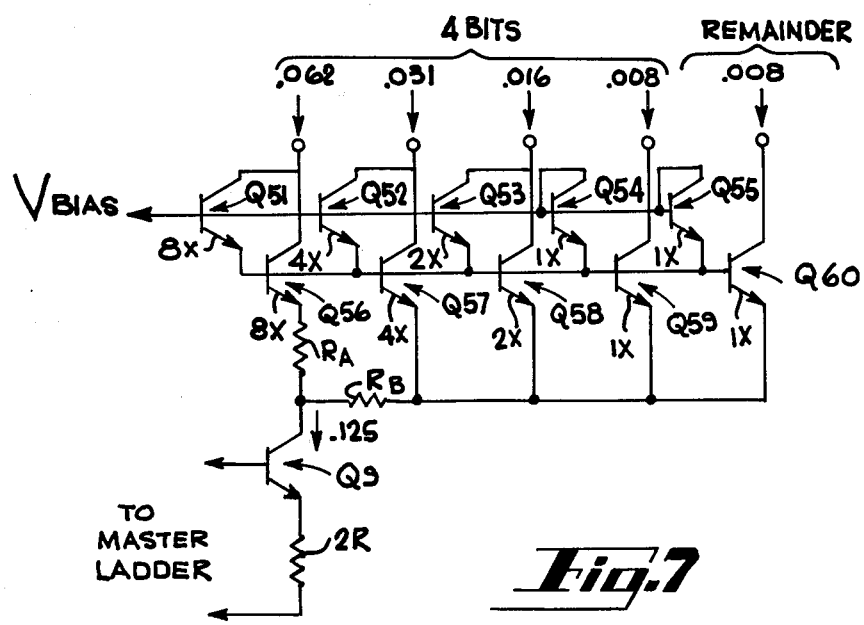
FIG. 7 is an electrical schematic showing an alternate version of the master-slave ladder of the present invention.

FIG. 7 is a slightly improved version of the apparatus of FIG. 6. The collector of transistor Q54 is connected to its base, thereby providing for faster switching of circuitry which may be attached to the collector of Q59, by eliminating collector capacitance of Q54 which may delay switching for the small current level which is seen by that collector. This means that the collector of transistor Q59 receives no feedback current and that its output error current will be greater. However, since this is the least significant bit, the increased current error is sacrificed for the advantage of being able to switch the current therein faster by means of an external switch. Since the compensating transistor Q55 duplicates the transistor of the least significant bit, its collector is also tied to the base thereof.

It will be realized that a third slave ladder, identical to the second slave ladder, may be connected to the second terminating means for further decrementing the second remainder signal in the same manner that the first slave ladder decrements the remainder signal from the master ladder. The number of cascaded slave ladders may continue and a large number of parallel decremented output signals will be provided.

I claim:

1. An improved electrical ladder for use in forming a plurality of weighted signals comprising,
  a master ladder network having an input reference signal means, a first signal scaling means having a plurality of first scaled output devices having a first scaling range connected for receiving said reference signal and dividing it into a plurality of decrementally weighted signals, one of said first output devices associated with each decrementally weighted signal,
  a first terminator means for generating a first remainder signal from said master ladder network, and
  a first slave ladder network having a second signal scaling means having a plurality of second scaled output devices, having a second scaling range, at least some of which is within said first scaling range, said second output devices connected to said master ladder for receiving said generated first remainder signal from said first terminator means and dividing it into a plurality of decrementally weighted signals, one of said second output devices associated with each decrementally weighted signal, and a second terminator means for generating a second remainder signal from said first slave ladder network, said first and second scaled output devices having separate output terminals for providing decremented signal outputs.

2. The apparatus of claim 1 wherein said second signal scaling means comprises an R-2R resistor ladder and said second output devices are transistors.

3. The apparatus of claim 1 wherein said second signal scaling means comprise scaled transistors and said second output devices are output electrodes of said scaled transistors.

4. The apparatus of claim 3 wherein each of said scaled transistors is a Darlington pair.

5. The apparatus of claim 3 wherein each of said scaled transistors is a scaled field effect transistor.

6. The apparatus of claim 3 wherein each of said scaled transistors is a scaled bipolar transistor.

7. The apparatus of claim 1 wherein said second signal scaling means comprise cascaded scaled transistors, each scaled transistor having base current compensation means with output electrodes for providing base current feedback to selected cascaded scaled transistors.

8. The apparatus of claim 7 wherein said base current compensation means comprises scaled transistors.

9. The apparatus of claim 7 wherein said selected cascaded scaled transistors receiving base current feedback are all transistors of said second scaling means.

10. The apparatus of claim 7 wherein said selected cascaded transistors receiving base current feedback are all transistors of said second scaling means except the cascaded transistors decrementing the smaller signals plus the transistor generating the second remainder signal.

11. The apparatus of claim 1 having
  a second slave ladder network having a third signal scaling means having a plurality of third output devices, having a third scaling range, at least some of which is within said second scaling range, said third output devices connected to said first slave ladder for receiving said generated second remainder signal from said second terminator means and dividing it into a plurality of decrementally weighted signals, one of said third output devices associated with each decrementally weighted signal, and a third terminator means for generating a third remainder signal from said second slave ladder network, said third scaled output devices having separate output terminals for providing decremented signal outputs.

12. An electrical scaled network comprising,
  a first group of cascaded, parallel connected, transistors having scaled emitters in succession mutually connected, and having mutually connected bases,
  a second group of cascaded, parallel connected, transistors equal in number to said first group and having scaled emitters in succession mutually connected, corresponding in scaling range to emitters of said first group, said emitters of the second group electrically united to the mutually connected bases of said first group, with each transistor of said first and second group having a collector, with collectors of transistors of equal order in succession mutually connected so that transistors of said second group compensate error current in corresponding transistors of said first group.

13. The apparatus of claim 12 wherein said mutually connected emitters of said first group are connected together through a resistor network.

* * * * *